US008686420B2

(12) United States Patent
Oh et al.

(10) Patent No.: US 8,686,420 B2
(45) Date of Patent: Apr. 1, 2014

(54) ORGANIC LIGHT EMITTING DIODE DISPLAY AND METHOD FOR MANUFACTURING THE SAME

(75) Inventors: Il-Soo Oh, Yongin (KR); Chang-Ho Lee, Yongin (KR); Hee-Joo Ko, Yongin (KR); Se-Jin Cho, Yongin (KR); Hyung-Jun Song, Yongin (KR); Jin-Young Yun, Yongin (KR); Jong-Hyuk Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 384 days.

(21) Appl. No.: 13/064,319

(22) Filed: Mar. 18, 2011

(65) Prior Publication Data
US 2011/0248269 A1   Oct. 13, 2011

(30) Foreign Application Priority Data

Apr. 8, 2010   (KR) .......................... 10-2010-0032336

(51) Int. Cl.
*H01L 51/00*   (2006.01)

(52) U.S. Cl.
USPC ........... 257/59; 257/72; 257/E51.018; 438/34

(58) Field of Classification Search
USPC ......... 257/59, 72, E51.018, E51.019; 438/34, 438/35
See application file for complete search history.

(56) References Cited

U.S. PATENT DOCUMENTS

| 2005/0264185 A1 | 12/2005 | Hoffmann |
| 2008/0290343 A1* | 11/2008 | Lee et al. ........................ 257/59 |
| 2008/0315763 A1 | 12/2008 | Dobbertin et al. |
| 2010/0052523 A1 | 3/2010 | Kim et al. |

FOREIGN PATENT DOCUMENTS

| CN | 1922928 A | 2/2007 |
| EP | 1722602 A1 | 11/2006 |
| JP | 2005-259550 A | 9/2005 |
| JP | 2008 041894 A | 2/2008 |
| KR | 10 2006-0053692 A | 5/2006 |
| KR | 10 2006-0092673 A | 8/2006 |
| KR | 10-075509 B1 | 11/2007 |
| KR | 10 2008-0001183 A | 1/2008 |

OTHER PUBLICATIONS

Yook et al.; Transparent organic light emitting diodes using a multilayer oxide as a low resistance transparent cathode; Applied Physics Letters; Jul. 2008; 013301-1-013301-3; 93; American Institute of Physics; United States.*

Yook, et al.; Transparent organic light emitting diodes using a multilayer oxide as a low resistance transparent cathode; Applied Physics Letters; 2008; 013301-1-013301-3; 93; American Institute of Physics; United States.

* cited by examiner

*Primary Examiner* — Julio J Maldonado
*Assistant Examiner* — Daniel Shook
(74) *Attorney, Agent, or Firm* — Lee & Morse, P.C.

(57) ABSTRACT

An organic light emitting diode (OLED) display includes a substrate including a plurality of pixels defined thereon, a thin film transistor (TFT) positioned at each pixel, a negative electrode electrically connected to the TFT, an organic emission layer positioned on the negative electrode, and a positive electrode positioned on the organic emission layer, the positive electrode including an auxiliary layer positioned on the organic emission layer, a conductive layer positioned on the auxiliary layer, and an insulation layer positioned on the conductive layer.

18 Claims, 5 Drawing Sheets

ORGANIC LIGHT EMITTING DIODE DISPLAY AND METHOD FOR MANUFACTURING THE SAME

BACKGROUND

1. Field

Example embodiments relate generally to an organic light emitting diode (OLED) display and a method for manufacturing the same and, more particularly, to an OLED display having an improved structure of an OLED, and a method for manufacturing the same.

2. Description of the Related Art

An active matrix type OLED display includes an organic light emitting element having a positive electrode, an organic emission layer, and a negative electrode, and a thin film transistor (TFT) for driving the organic light emitting element. In the active matrix type OLED display, holes injected from the positive electrode and electrons injected from the negative electrode are combined in the organic emission layer to generate excitons, and light is emitted by energy generated when the excitons fall to a base state from an excited state. The OLED display displays an image through such light emission.

The organic light emitting element may be formed as the organic emission layer, and the organic emission layer and the negative electrode may be sequentially stacked on the positive electrode connected with the TFT. In this structure, because the positive electrode is connected with the TFT, the TFT is a p-type TFT, and accordingly, a semiconductor layer of the TFT is made of polycrystalline silicon, e.g., formed by a crystallization process.

In this case, however, it is not easy to perform or obtain uniform crystallization, so the characteristics of the semiconductor layer formed thusly may not be uniform. Therefore, an OLED display having such a non-uniform semiconductor layer may have non-uniform light emission characteristics, and/or the OLED display may become defective. If the OLED display is increased in size, the problem would become more serious.

The above information disclosed in this Background section is only for enhancement of understanding of the background of the described technology and therefore it may contain information that does not form the prior art that is already known in this country to a person of ordinary skill in the art.

SUMMARY

Embodiments are therefore directed to an OLED display and a method for manufacturing the same, which substantially overcome one or more of the problems due to the limitations and disadvantages of the related art.

It is therefore a feature of an embodiment to provide an OLED display with an improved structure of a positive electrode.

It is therefore another feature of an embodiment to provide a method of manufacturing an OLED display with an improved structure of a positive electrode without damaging an organic emission layer.

At least one of the above and other features and advantages may be realized by providing an OLED display, including a substrate on which a plurality of pixels are defined, a TFT positioned at each pixel, a negative electrode electrically connected to the TFT, an organic emission layer positioned on the negative electrode, and a positive electrode positioned on the organic emission layer. The positive electrode may include an auxiliary layer positioned on the organic emission layer, a conductive layer positioned on the auxiliary layer; and an insulation layer positioned on the conductive layer.

The auxiliary layer may include at least one of tungsten oxide, molybdenum oxide, fullerene (C60), copper phthalocyanine (CuPc), tetracyanoquinodimethane (TCNQ), triphenyltetrazoliumchloride naphthalenetetracarboxylic dianhydride (NTCDA), perylenetetracarboxylic dianhydride (PTCDA), and copper hexadecafluorophthalocyanine ($F_{16}$CuPc). The conductive layer may include at least one of silver, aluminum, chromium, samarium, and their alloys. The insulation layer may include at least one of silicon oxide, molybdenum oxide, tungsten oxide, an organic material, and an inorganic material.

Here, the auxiliary layer may include tungsten oxide, the conductive layer may include silver, and the insulation layer may include tungsten oxide.

Here, the auxiliary layer may be formed by stacking a low energy level material layer containing a material having a lower energy level than that of the layer constituting the organic emission layer and a dipole material layer containing a dipole material. The low energy level material layer may include tungsten oxide. The dipole material layer may include at least one of molybdenum oxide, fullerene, copper phthalocyanine, tetracyanoquinodimethane (TCNQ), triphenyltetrazoliumchloride (TTC), naphthalenetetracarboxylic dianhydride (NTCDA), perylenetetracarboxylic dianhydride (PTCDA), and copper hexadecafluorophthalocyanine ($F_{16}$CuPc).

The conductive layer may have a thickness ranging from about 8 nm to about 24 nm. The insulation layer may have a thickness ranging from about 30 nm to about 80 nm. The low energy level material layer may have a thickness ranging from about 5 nm to about 40 nm, and the dipole material layer may have a thickness of about 10 nm or smaller.

The auxiliary layer, the conductive layer, and the insulation layer may be formed through thermal evaporation.

At least one of the above and other features and advantages may also be realized by providing a method for manufacturing an OLED display, including preparing a substrate with a plurality of pixels defined thereon, forming a TFT at each pixel, forming a negative electrode such that the negative electrode is connected with the TFT, forming an organic emission layer on the negative electrode, and forming a positive electrode on the organic emission layer. In forming the positive electrode, an auxiliary layer, a conductive layer, and an insulation layer may be sequentially formed through thermal evaporation on the organic emission layer.

The auxiliary layer may include at least one of tungsten oxide, molybdenum oxide, fullerene (C60), copper phthalocyanine (CuPc), tetracyanoquinodimethane (TCNQ), triphenyltetrazoliumchloride (TTC), naphthalenetetracarboxylic dianhydride (NTCDA), perylenetetracarboxylic dianhydride (PTCDA), and copper hexadecafluorophthalocyanine ($F_{16}$CuPc). The conductive layer may include at least one of silver, aluminum, chromium, samarium, and their alloys. The insulation layer may include at least one of silicon oxide, molybdenum oxide, tungsten oxide, an organic material, and an inorganic material. Here, the auxiliary layer may include tungsten oxide, the conductive layer may include silver, and the insulation layer may include tungsten oxide.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
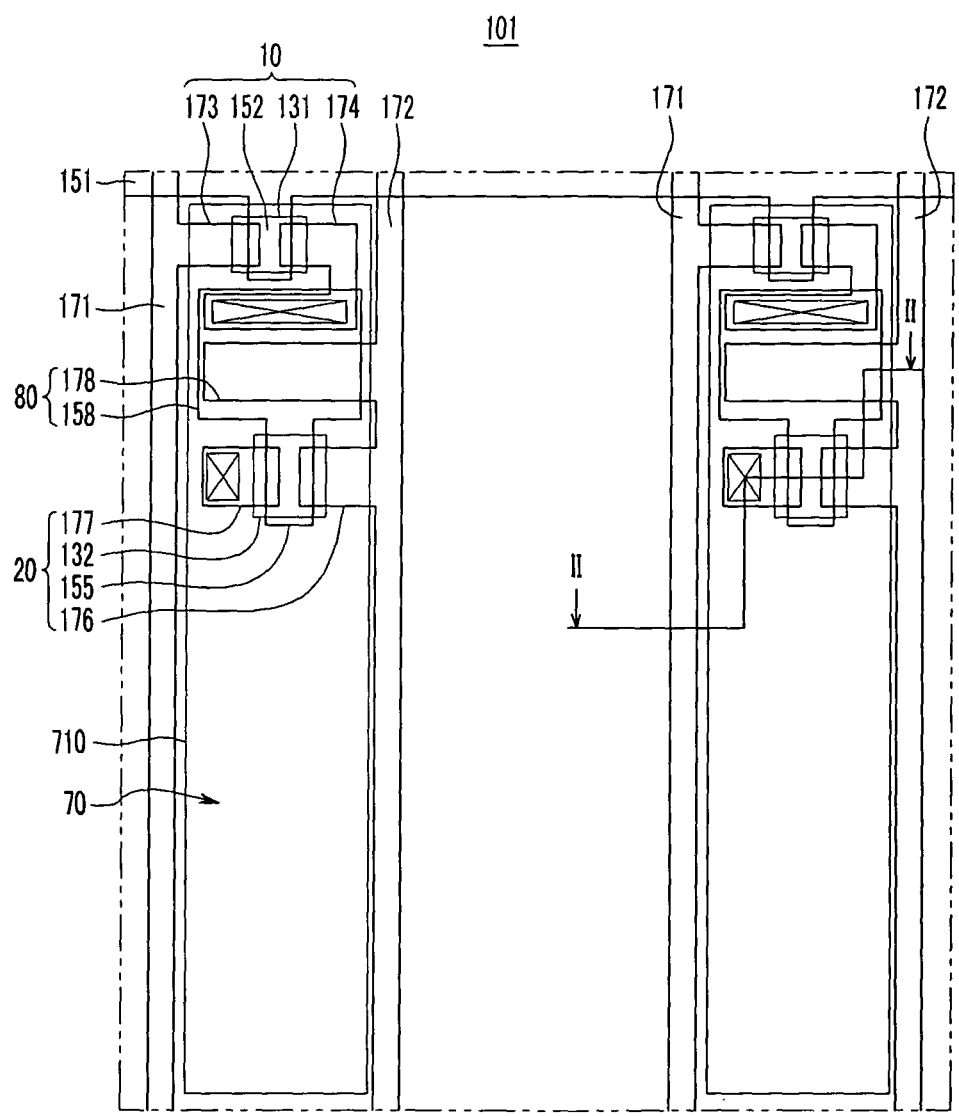
FIG. 1 illustrates a layout view of an organic light emitting diode (OLED) display according to an exemplary embodiment.

Korean Patent Application No. 10-2010-0032336, filed on Apr. 8, 2010 the Korean Intellectual Property Office, and entitled: "Organic Light Emitting Diode Display and Method for Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

An OLED display according to an exemplary embodiment will now be described with reference to FIGS. 1 to 4. FIG. 1 illustrates a layout view of an OLED display according to an exemplary embodiment, and FIG. 2 illustrates a cross-sectional view taken along line II-II in FIG. 1.

Figure 2:
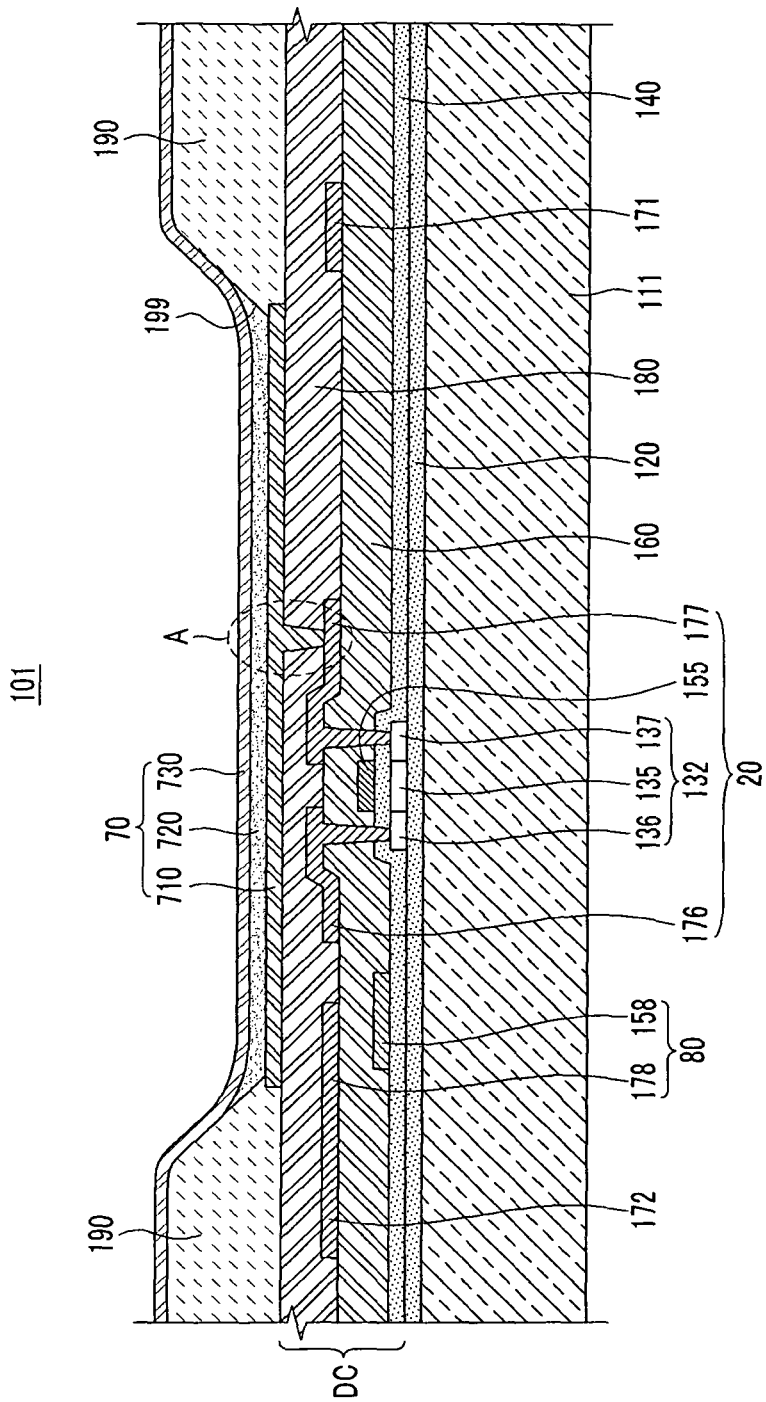
FIG. 2 illustrates a cross-sectional view taken along line II-II in FIG. 1.

As illustrated in FIGS. 1 and 2, an OLED display 101 according to the present exemplary embodiment may include a switching thin film transistor (TFT) 10, a driving TFT 20, a storage capacitor 80, and an organic light emitting element 70, e.g., an OLED 70, formed at each of a plurality of pixels defined on a substrate main body 111. The OLED display 101 may further include a gate line 151 disposed along one direction, a data line 171 crossing the gate line 151 and insulated therefrom, and a common power line 172.

Here, the respective pixels may be defined by the gate line 151, the data line 171, and the common power line 172 as boundaries, but example embodiments are not necessarily limited thereto.

A buffer layer 120 may be additionally formed between the substrate main body 111, the switching TFT 10, the organic light emitting element 70, and the like. The buffer layer 120 serves to smooth the surface while preventing infiltration of unnecessary components, e.g., an impurity element or moisture. However, the buffer layer 120 is not a requisite and may be omitted according to the type and processing conditions of the substrate main body 111.

The organic light emitting element 70 may include a negative electrode 710, an organic emission layer 720 formed on the negative electrode 710, and a positive electrode 730 formed on the organic emission layer 720. Here, one or more negative electrodes 710 are formed at each pixel, so the OLED display 101 may have a plurality of separated negative electrodes 710. Light is emitted when excitons, i.e., generated as holes and electrons injected into the organic emission layer 720 are combined, fall to a base station from an excited state.

The organic emission layer 720 may include a low-molecular-weight organic material or a high-molecular-weight organic material. The organic emission layer 720 may be formed as a multi-layer including one or more of a light emission layer, a hole injection layer (HIL), a hole transport layer (HTL), an electron transport layer (ETL), and an electron injection layer (EIL). For example, if the organic emission layer 720 includes all of the above layers, the EIL may be disposed on the negative electrode 710, and the ETL, the organic emission layer, the HTL, and the HIL may be sequentially stacked thereon.

It is noted that in the present exemplary embodiment, an inverted structure is used, where the negative electrode 710 is connected to the driving TFT 20 and the organic emission layer 720 and the positive electrode 730 are sequentially stacked on the negative electrode 710. The inverted structure will be described in detail later with reference to FIG. 3.

The storage capacitor 80 includes a pair of storage plates 158 and 178 disposed with an interlayer insulation layer 160 interposed therebetween. Here, the interlayer insulation layer 160 is a dielectric material. Capacitance is determined by the voltage formed between charges charged in the storage capacitor 80 and the pair of storage plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. In the present exemplary embodiment, the switching and driving semiconductor layers 131 and 132 and the switching and driving gate electrodes 152 and 155 are formed with the gate insulation layer 140 interposed therebetween. The switching and driving semiconductor layers 131 and 132, the switching and driving source electrodes 173 and 176, and the switching and driving drain electrodes 174 and 177 are connected by contact holes formed at the gate insulation layer 140 and the interlayer insulation layer 160, but example embodiments are not limited to such a structure.

The switching TFT 10 is used as a switching element for selecting pixels to emit light. The switching gate electrode 152 is connected to the gate line 151, and the switching source electrode 173 is connected to the data line 171. The switching drain electrode 174 is disposed to be separated from the switching source electrode 173 and connected with one storage plate 158.

The driving TFT 20 applies driving power for making the organic emission layer 720 of the organic light emitting element 70 emit light within selected pixels to the negative electrode 710. The driving gate electrode 155 is connected with the storage plate 158 connected with the switching drain electrode 174. The driving source electrode 176 and the other storage plate 178 are connected with the common source line 172. The driving drain electrode 177 is connected to the negative electrode 710 of the organic light emitting element 70 through a contact hole of a polarization layer 180. However, example embodiments are not limited thereto, and the polarization layer 180 may not be formed, e.g., the drain electrode 177 and the pixel electrode 710 may be formed on the same layer. The negative electrodes 710 corresponding to the respective pixels are maintained to be insulated from each other by a pixel defining film 190.

With such a structure, the switching TFT 10 is operated by a gate voltage applied to the gate line 151 to transfer a data voltage applied to the data line 171 to the driving TFT 20. A voltage corresponding to the difference between a common voltage applied from the common power line 172 to the driving TFT 20 and the data voltage applied from the switching TFT 10 is stored in the storage capacitor 80, and current corresponding to the voltage stored in the storage capacitor 80 flows to the organic light emitting element 70 via the TFT 20 to allow the organic light emitting element 70 to emit light.

Figure 3:
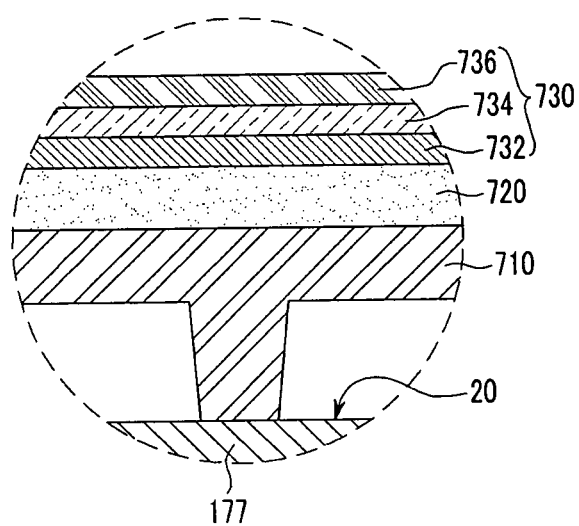
FIG. 3 illustrates an enlarged view of a portion 'A' in FIG. 1.

The organic light emitting element 70 according to the present exemplary embodiment will now be described in detail with reference to FIGS. 2 and 3. FIG. 3 illustrates an enlarged view of a portion 'A' in FIG. 1.

In the present exemplary embodiment, as described above, the organic light emitting element 70 may include an inverted structure. Therefore, the negative electrode 710 may be connected to the driving TFT 20, and the organic emission layer 720 and the positive electrode 730 may be sequentially stacked on the negative electrode 710, i.e., the negative electrode 710 may be between the organic emission layer 720 and the driving TFT 20.

As shown in FIG. 2, the driving semiconductor layer 132 includes a channel area 135 on which impurities are not doped and a source area 136 and a drain area 137 positioned at both sides of the channel area 135 and having impurities doped therein. In the present exemplary embodiment, because the negative electrode 710 is connected to the driving TFT 20, the source area 136 and the drain area 137 may be doped with n-type impurities. In this manner, because the present exemplary embodiment has the inverted structure, the TFT, e.g., the driving TFT 20, may be formed as an n-type TFT.

Thus, the switching and driving semiconductor layers 131 and 132 may be made of an oxide semiconductor material that does not need a crystallization process. Accordingly, a crystallization process may be omitted and the stability of the formation of the semiconductor layers may be improved.

With reference to FIG. 3, in the present exemplary embodiment, the positive electrode 730 may include an auxiliary layer 732 on, e.g., directly on, the organic emission layer 720 to assist injection of holes into the organic emission layer 720. Further, the positive electrode 730 may include a conductive layer 734 positioned on, e.g., directly on, the auxiliary layer 732, and an insulation layer 736 positioned on, e.g., directly on, the conductive layer 734.

Here, the auxiliary layer 732 serves to assist injection of holes into the organic emission layer 720 (or a hole injection layer of the organic emission layer 720) from the positive electrode 730. Namely, in the present exemplary embodiment, the auxiliary layer 732 may be made of a material that can adjust an energy barrier between the conductive layer 734 and the organic emission layer 720. Therefore, the auxiliary layer 732 may be inserted between the conductive layer 734 and the organic emission layer 720 in order to facilitate hole injection into the organic emission layer 720 from the conductive layer 734.

Figure 4:
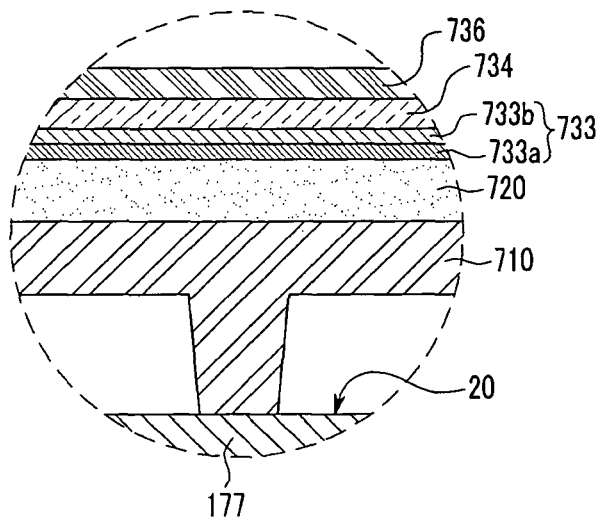
FIG. 4 illustrates an enlarged view of a positive electrode part of an OLED display according to another exemplary embodiment.

The auxiliary layer 732 may include a material having a lower energy level than that of the organic emission layer 720 (or of the hole injection layer of the organic emission layer 720) or of a dipole material. For example, the auxiliary layer 732 may consist essentially of, e.g., may be made of only, the material having a low energy level or may consist essentially of, e.g., may be made of only, the dipole material. In another example, the auxiliary layer 723 may include both the material having a low energy level and the dipole material. In yet another example, as shown in FIG. 4, an auxiliary layer 733 may be formed by stacking a dipole material layer 733*a* and a material layer 733*b* having a low energy level.

Examples of the material having a lower energy level than that of the organic emission layer 720 (or the hole injection layer of the organic emission layer 720) may include tungsten oxide, and the like. Examples of the dipole material may include molybdenum oxide, fullerene, copper phthalocyanine, tetracyanoquinodimethane (TCNQ), triphenyltetrazolium chloride (TTC), naphthalenetetracarboxylic dianhydride (NTCDA), perylenetetracarboxylic dianhydride (PTCDA), copper hexadecafluorophthalocyanine ($F_{16}$CuPc), and the like. Here, the materials noted above, e.g., TCNQ, TTC, NTCDA, PTCDA, $F_{16}$CuPC, and the like, may easily attract electrons, so the noted materials may facilitate injection of holes into the organic emission layer 720.

The conductive layer 734 formed on the auxiliary layer 732 may be made of a material having good conductivity. Therefore, the conductive layer 734 may lower resistance of the positive electrode 730. For example, the conductive layer 734 may be made of a metal material having good conductivity, e.g., silver, aluminum, chromium, samarium, or their alloys.

The insulation layer 736 positioned on the conductive layer 734 serves to adjust transmittance of light emitted from the OLED display 101. The insulation layer 736 may be made of, e.g., silicon oxide, molybdenum oxide, tungsten oxide, an organic material, and an inorganic material. Here, because the tungsten oxide has a high transmittance, the insulation layer 736 may be made of tungsten oxide to have a higher transmittance. Examples of the organic material may include, but are not limited to, a low molecular organic material, e.g., aluminum quinoline functionality (Alq3), or the like. Examples of the inorganic material may include, but are not limited to, e.g., silicon oxide, silicon nitride, and the like.

Therefore, as described above, the positive electrode 730 may be configured to include the auxiliary layer 732 to assist the hole injection, the conductive layer 734 to lower resistance, and the insulation layer 736 to adjust light transmittance. Accordingly, because the auxiliary layer 732 assists the injection of holes into the organic emission layer 720, luminous efficiency of the OLED display 101 may be improved. Also, the positive electrode 730 may have low resistance due to the low resistance of the conductive layer 734. Further, because the auxiliary layer 732, the conductive layer 734, and the insulation layer 736 are sequentially stacked to form the positive electrode 730, resistances are connected in series, thereby further reducing the resistance of the positive electrode 730. Accordingly, the luminous efficiency of the OLED display 101 may be improved and an occurrence of a non-uniformity phenomenon of panel luminance due to a voltage drop (IR drop) may be prevented.

Also, the transmittance of light emitted from the OLED display 101 may be improved by the insulation layer 736 that serves to adjust transmittance. In addition, because the conductive layer 734 made of a material having good reflectance, i.e., reflectivity, is positioned between the auxiliary layer 732 and the insulation layer 736, out-coupling by microcavity may be improved through multiple reflection. Accordingly, the luminous efficiency of the OLED display 101 may be further improved.

As a result, in the present exemplary embodiment, because the positive electrode 730 includes the auxiliary layer 732, the conducive layer 734, and the insulation layer 736, the light emission characteristics and luminous efficiency of the OLED display 101 may be enhanced.

Here, the characteristics of the positive electrode 730 may further be improved by limiting the thickness of the auxiliary layer 732, the conductive layer 734, and the insulation layer 736. For example, when the auxiliary layer 732 is made of a material having a low energy level, it may have a thickness ranging from about 5 nm to about 40 nm, e.g., about 10 nm. If the thickness of the auxiliary layer 732 exceeds 40 nm, the hole injection characteristics of the auxiliary layer 732 may be degraded, while if the thickness of the auxiliary layer 732 is smaller than 5 nm, a process stability may be degraded, i.e., making it difficult to form a thin film. In another example, when the auxiliary layer 732 is made of a dipole material, it may have a thickness of about 10 nm or smaller in order to assume dipole characteristics. In yet another example, with reference to FIG. 4, when the auxiliary layer 733 includes both the dipole material layer 733a and the material layer 733b having a low energy level, the dipole material layer 733b may have a thickness of about 10 nm or smaller and the material layer 733b having a low energy level may have a thickness ranging from about 5 nm to about 40 nm for those reasons as mentioned above.

The resistance and transmission characteristics of the positive electrode 730 may be adjusted by adjusting the thickness of the conductive layer 734. That is, resistance may be lowered by increasing the thickness of the conductive layer 734, and accordingly, electrical characteristics of the positive electrode 730 may be improved. Transmittance of the positive electrode 730 may be improved by reducing the thickness of the conductive layer 734. The OLED display 101 may be also used as a transparent display by reducing the thickness of the conductive layer 734.

Considering both the resistance and transmittance characteristics, the conductive layer 734 may have a thickness ranging from about 8 nm to about 24 nm. If the thickness of the conductive layer 734 exceeds 24 nm, the transmittance of the positive electrode 730 may be too low. If the thickness of the conductive layer 734 is smaller than 8 nm, the resistance of the positive electrode 730 may be too high. When the resistance characteristics are intended to be further improved, the conductive layer 734 may be formed to have a thickness ranging from about 16 nm to about 24 nm. When the transmittance is intended to be further improved, the conductive layer 734 may be formed to have a thickness ranging from about 8 nm to about 16 nm.

The insulation layer 736 may be formed to have such a thickness as to maximize a light efficiency. For example, the insulation layer 736 may have a thickness ranging from about 30 nm to about 80 nm. When the thickness of the insulation layer 736 exceeds 80 nm or is smaller than 30 nm, the wavelength of light may change to degrade optical characteristics.

In the present exemplary embodiment, the auxiliary layer 732, the conductive layer 734, and the insulation layer 736 constituting the positive electrode 730 may be made of materials that can be deposited through thermal evaporation. Therefore, the organic emission layer 720 may be prevented from being damaged when the positive electrode 730 is formed. This will now be described in more detail below with reference to FIG. 5.

Figure 5:
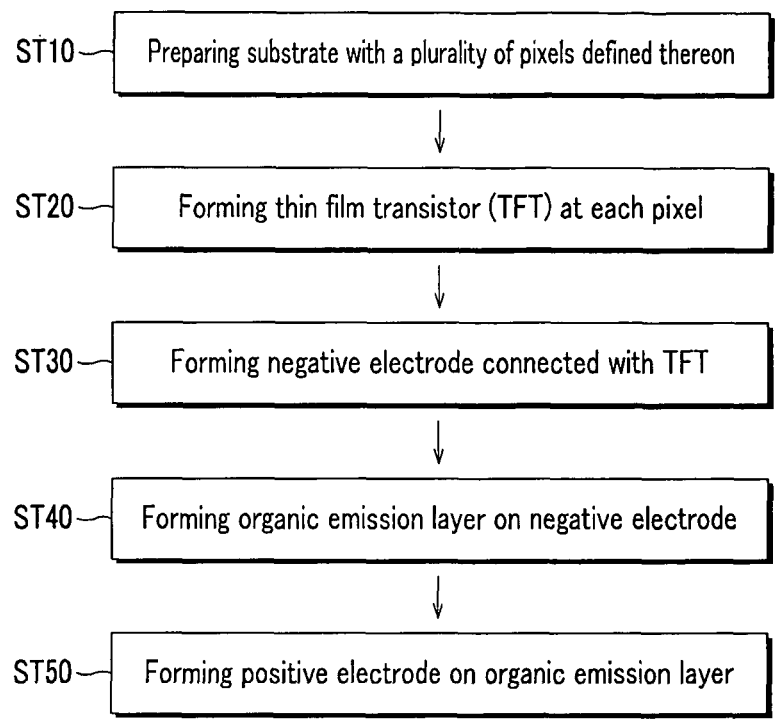
FIG. 5 illustrates a flow chart of the process of a method for manufacturing an OLED display according to an exemplary embodiment.

FIG. 5 illustrates a flow chart of a method for manufacturing an OLED display according to an exemplary embodiment. As shown in FIG. 5, the method for manufacturing an OLED display according to the present exemplary embodiment may include an operation ST10 for preparing a substrate with a plurality of pixels defined thereon, an operation ST20 for forming a TFT at each pixel, an operation ST30 for forming a negative electrode to be connected with the TFT, an operation ST40 for forming an organic emission layer on the negative electrode, and an operation ST50 for forming a positive electrode on the organic emission layer. It is noted that various conventional methods may be applicable to the operations ST10 through ST40, and therefore, a detailed description thereof will be omitted.

In the present exemplary embodiment, in the operation ST50 for forming the positive electrode, the auxiliary layer (732 in FIG. 3 or 733 in FIG. 4), the conductive layer (734 in FIGS. 3 and 4), and the insulation layer (736 in FIGS. 3 and 4) may be sequentially formed through thermal evaporation.

In the present exemplary embodiment, the auxiliary layers 732 and 733 may be made of, e.g., tungsten oxide, molybdenum oxide, fullerene, copper phthalocyanine, or the like, the conductive layer 734 may be made of, e.g., silver, aluminum, chromium, samarium, or their alloys, and the insulation layer 736 may be made of, e.g., silicon oxide, molybdenum oxide, tungsten oxide, an organic material, an inorganic material, or the like. Thus, because the auxiliary layers 732 and 733, the conductive layer 734, and the insulation layer 736 constituting the positive electrode 730 are made of materials that may be formed through thermal evaporation, the auxiliary layers 732 and 733, the conductive layer 734, and the insulation layer 736 may be sequentially formed through thermal evaporation.

Thermal evaporation equipment used for the thermal evaporation method may include a boat or crucible for receiving or holding an evaporation material therein and a hot wire (or heat rays) for heating the boat or crucible. As the deposition material held in the boat or crucible is evaporated by the hot wire, the auxiliary layers 732 and 733, the conductive layer 734, and the insulation layer 736 may be formed on the organic emission layer 720, respectively. For example, the auxiliary layers 732 and 733 may be formed by processing tungsten oxide at about 800° C. or higher through thermal evaporation, the conductive layer 734 may be formed by processing silver at about 1000° C. or higher through thermal evaporation, and the insulation layer 736 may be formed by processing tungsten oxide at about 800° C. or higher through thermal evaporation. In the above case, the tungsten oxide may have purity of about 99.9%, and the silver may have purity of about 99.999%.

In this manner, when the positive electrode 730 is formed through thermal evaporation, the positive electrode 730 may be formed without damaging the organic emission layer 720, e.g., as compared to formation of a positive electrode via sputtering. Namely, in the present exemplary embodiment, even though the organic light emitting element 70 has an inverted structure, the positive electrode 730 may be formed to exhibit excellent characteristics without damaging the organic emission layer 720.

Example embodiments will now be described in more detail with reference to an Experimental Example and a Comparative Example. However, these are merely illustrative and example embodiments are not meant to be limited thereto.

EXPERIMENTAL EXAMPLE

Tungsten oxide was thermally evaporated at 800° C. to form an auxiliary layer with a thickness of 40 nm. Next, silver was thermally evaporated onto the auxiliary layer at 1000° C. to form a conductive layer with a thickness of 12 nm. Next, tungsten oxide was thermally evaporated at 800° C. to form an insulation layer with a thickness of 40 nm on the conductive layer, thereby manufacturing a positive electrode. In this manner, the thickness of the conductive layer was varied to be 16 nm, 24 nm, 29 nm, 40 nm, and 50 nm.

COMPARATIVE EXAMPLE

Indium-tin oxide (ITO) was sputtered to form a positive electrode.

Surface resistances of the positive electrodes manufactured according to the Experimental Example were measured and shown in Table 1 below, and surface resistance of the positive electrode manufactured according to the Comparative Example was measured to be 10Ω/□.

TABLE 1

| Thickness of auxiliary layer [nm] | Thickness of conductive layer [nm] | Thickness of insulation layer [nm] | Surface resistance [10Ω/□] |
|---|---|---|---|
| 40 | 12 | 40 | 12.11 |
| 40 | 16 | 40 | 5.13 |
| 40 | 24 | 40 | 1.94 |
| 40 | 29 | 40 | 1.55 |
| 40 | 40 | 40 | 1.05 |
| 40 | 50 | 40 | 1.68 |

It is noted that the positive electrodes manufactured according to the Experimental Example exhibited surface resistance which is similar to or smaller than that of the positive electrode manufactured according to the Comparative Example. In particular, it is noted that the positive electrodes having the conductive layers whose thickness is 16 nm or larger have excellent surface resistance, compared with the positive electrode manufactured according to the Comparative Example.

The OLED display according to an exemplary embodiment may include an organic light emitting element with a negative electrode connected to a TFT and a positive electrode having an auxiliary layer, a conductive layer, and an insulation layer. The structure of the positive electrode may enhance luminance, lower resistance, and improve transmittance. Therefore, the OLED display may have excellent luminous efficiency and luminescent properties. Further, as the auxiliary layer, the conductive layer, and the insulation layer of the positive electrode are formed through thermal evaporation, the organic emission layer may be prevented from being damaged in the process of forming the positive electrode.

In contrast, when a conventional organic light emitting element has an inverted structure, i.e., a structure where the negative electrode, the organic emission layer, and the positive electrode are sequentially stacked, the negative electrode is connected with the TFT to form an n-type TFT. In this case, the positive electrode is formed by sputtering a transparent conductive material, e.g., indium-tin oxide (ITO) or the like. However, the organic emission layer may be damaged during the sputtering process. Also, because the ITO of the conventional positive electrode has high resistance, a voltage drop (IR drop) phenomenon may occur, thereby causing non-uniform luminance. In addition, in such a large-scale OLED display, a middle portion thereof may not be illuminated.

DESCRIPTION OF SYMBOLS

720: organic emission layer
732: auxiliary layer
734: conductive layer
736: insulation layer Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
   a substrate including a plurality of pixels defined thereon;
   a thin film transistor (TFT) positioned at each pixel;
   a negative electrode electrically connected to the TFT;
   an organic emission layer positioned on the negative electrode, the organic emission layer including at least a light emission layer, a hole injection layer, and a hole transport layer; and
   a positive electrode positioned on the organic emission layer, the positive electrode including an auxiliary layer positioned on the organic emission layer, a conductive layer positioned on the auxiliary layer, and an insulation layer positioned on the conductive layer,
   wherein the auxiliary layer includes a stacked structure of a low energy level material layer and a dipole material layer, the low energy level material including a material having a lower energy level than that of the organic emission layer, and the dipole material layer including a dipole material.

2. The OLED display as claimed in claim 1, wherein the auxiliary layer includes at least one of tungsten oxide, molybdenum oxide, fullerene (C60), copper phthalocyanine (CuPc), tetracyanoquinodimethane (TCNQ), triphenyltetrazoliumchloride (TTC), naphthalenetetracarboxylic dianhydride (NTCDA), perylenetetracarboxylic dianhydride (PTCDA), and copper hexadecafluorophthalocyanine ($F_{16}CuPc$).

3. The OLED display as claimed in claim 1, wherein the conductive layer includes at least one of silver, aluminum, chromium, samarium, and alloys thereof.

4. The OLED display as claimed in claim 1, wherein the insulation layer includes at least one of silicon oxide, molybdenum oxide, tungsten oxide, an organic material, and an inorganic material.

5. The OLED display as claimed in claim 1, wherein the auxiliary layer includes tungsten oxide, the conductive layer includes silver, and the insulation layer includes tungsten oxide.

6. The OLED display as claimed in claim 1, wherein the low energy level material layer includes tungsten oxide, and the dipole material layer includes at least one of molybdenum oxide, fullerene, copper phthalocyanine, tetracyanoquinodimethane, triphenyltetrazoliumchloride, naphthalenetetracarboxylic dianhydride, perylenetetracarboxylic dianhydride, and copper hexadecafluorophthalocyanine.

7. The OLED display as claimed in claim 1, wherein the low energy level material layer has a thickness ranging from about 5 nm to about 40 nm, and the dipole material layer has a thickness of about 10 nm or smaller.

8. The OLED display as claimed in claim 1, wherein the conductive layer has a thickness ranging from about 8 nm to about 24 nm.

9. The OLED display as claimed in claim 8, wherein the conductive layer has a thickness ranging from about 16 nm to about 24 nm.

10. The OLED display as claimed in claim 1, wherein the insulation layer has a thickness ranging from about 30 nm to about 80 nm.

11. The OLED display as claimed in claim 1, wherein the auxiliary layer, the conductive layer, and the insulation layer are sequentially stacked on the organic layer.

12. The OLED display as claimed in claim 1, wherein the organic emission layer is directly on the negative electrode.

13. The OLED display as claimed in claim 1, wherein the auxiliary layer is directly on the hole injection layer.

14. A method for manufacturing an organic light emitting diode (OLED) display, the method comprising:
preparing a substrate with a plurality of pixels defined thereon;
forming a thin film transistor (TFT) at each pixel;
forming a negative electrode, such that the negative electrode is electrically connected to the TFT;
forming an organic emission layer on the negative electrode, the organic emission layer including at least a light emission layer, a hole injection layer, and a hole transport layer; and
forming a positive electrode on the organic emission layer, the positive electrode including an auxiliary layer on the organic emission layer, a conductive layer on the auxiliary layer, and an insulation layer on the conductive layer,
wherein the auxiliary layer includes a stacked structure of a low energy level material layer and a dipole material layer, the low energy level material including a material having a lower energy level than that of the organic emission layer, and the dipole material layer including a dipole material.

15. The method as claimed in claim 14, wherein the auxiliary layer is formed of at least one of tungsten oxide, molybdenum oxide, fullerene (C60), copper phthalocyanine (CuPc), tetracyanoquinodimethane (TCNQ), triphenyltetrazoliumchloride (TTC), naphthalenetetracarboxylic dianhydride (NTCDA), perylenetetracarboxylic dianhydride (PTCDA), and copper hexadecafluorophthalocyanine ($F_{16}CuPc$).

16. The method as claimed in claim 14, wherein the conductive layer is formed of at least one of silver, aluminum, chromium, samarium, and alloys thereof.

17. The method as claimed in claim 14, wherein the insulation layer is formed of at least one of silicon oxide, molybdenum oxide, tungsten oxide, an organic material, and an inorganic material.

18. The method as claimed in claim 14, wherein the auxiliary layer is formed of tungsten oxide, the conductive layer is formed of silver, and the insulation layer is formed of tungsten oxide.

* * * * *